United States Patent
Lee

(10) Patent No.: US 10,861,511 B2
(45) Date of Patent: Dec. 8, 2020

(54) SEMICONDUCTOR DEVICES

(71) Applicant: SK hynix Inc., Icheon-si (KR)

(72) Inventor: Yoo Jong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/592,557

(22) Filed: Oct. 3, 2019

(65) Prior Publication Data

US 2020/0294561 A1    Sep. 17, 2020

(30) Foreign Application Priority Data

Mar. 14, 2019 (KR) .......................... 10-2019-0029334

(51) Int. Cl.
*G11C 7/22* (2006.01)
*G11C 7/10* (2006.01)

(52) U.S. Cl.
CPC .......... *G11C 7/1096* (2013.01); *G11C 7/109* (2013.01); *G11C 7/1084* (2013.01); *G11C 7/1087* (2013.01); *G11C 7/222* (2013.01)

(58) Field of Classification Search
CPC ... G11C 7/1096; G11C 7/1084; G11C 7/1087; G11C 7/109; G11C 7/222
USPC .................................................. 365/189.16
See application file for complete search history.

(56) References Cited

U.S. PATENT DOCUMENTS 9,805,802 B2 * 10/2017 Son ................. G06F 13/1673
2017/0076768 A1 * 3/2017 Son ..................... G11C 16/102

FOREIGN PATENT DOCUMENTS

KR    1020170088138 A    8/2017

OTHER PUBLICATIONS

Sung Chun Jang et al., "Semiconductor Device", KR10-2018-0068348 filed on Jun. 14, 2018, SK hynix Inc., Republic of Korea.

* cited by examiner

*Primary Examiner* — Xiaochun L Chen
(74) *Attorney, Agent, or Firm* — William Park & Associates Ltd.

(57) ABSTRACT

A semiconductor device includes a drive control circuit and a write control circuit. The drive control circuit generates a pre-drive control signal and a drive control signal based on a latch command and generates a pattern drive control signal based on a pattern latch command. The write control circuit stores drive data generated from data inputted based on the pre-drive control signal and the drive control signal or stores the drive data driven to a predetermined logic level based on the pattern drive control signal.

21 Claims, 10 Drawing Sheets

FIG.2

| ICS | ICLK | ICA<1> | ICA<2> | ICA<3> | ICA<4> | ICA<5> | ICA<6> | ICA<7> |
|---|---|---|---|---|---|---|---|---|
| H | rising | L | L | H | V | V | V | V |
| X | falling | V | V | V | V | H | V | V |

SEMICONDUCTOR DEVICES

CROSS-REFERENCE TO RELATED APPLICATIONS

The present application claims priority under 35 U.S.C. 119(a) to Korean Application No. 10-2019-0029334, filed on Mar. 14, 2019, which is incorporated herein by reference in its entirety.

BACKGROUND

1. Technical Field

Embodiments of the present disclosure generally relate to semiconductor devices configured to perform a write operation.

2. Related Art

Semiconductor devices such as dynamic random access memory (DRAM) devices perform a write operation and a read operation. The write operation is an operation for storing data into a bank including cell arrays selected by an address, and the read operation is an operation for outputting the data stored in the cell arrays included in the bank.

SUMMARY

According to an embodiment, a semiconductor device may include a drive control circuit and a write control circuit. The drive control circuit may be configured to generate a pre-drive control signal and a drive control signal based on a latch command and configured to generate a pattern drive control signal based on a pattern latch command. The write control circuit may be configured to store drive data generated from data inputted based on the pre-drive control signal and the drive control signal or configured to store the drive data driven to a predetermined logic level based on the pattern drive control signal.

According to an embodiment, a semiconductor device may include a latch command generator and a drive control circuit. The latch command generator may be configured to generate a latch command from a write command during a write operation and may be configured to generate a pattern latch command from a pattern write command during a pattern write operation. The drive control circuit may be configured to generate a pre-drive control signal and a drive control signal based on the latch command during the write operation and may be configured to generate a pattern drive control signal based on the pattern latch command during the pattern write operation.

BRIEF DESCRIPTION OF THE DRAWINGS

FIG. 2 is a table illustrating an operation for generating a pattern write command and a pattern input flag in the semiconductor device of FIG. 1.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. Further, the logic levels of the signals may be different from or the opposite of those described. For example, a signal described as having a logic "high" level may alternatively have a logic "low" level, and a signal described as having a logic "low" level may alternatively have a logic "high" level.

Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

For reference, an embodiment including additional components may be provided. Furthermore, an active high or active low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

Figure 1:
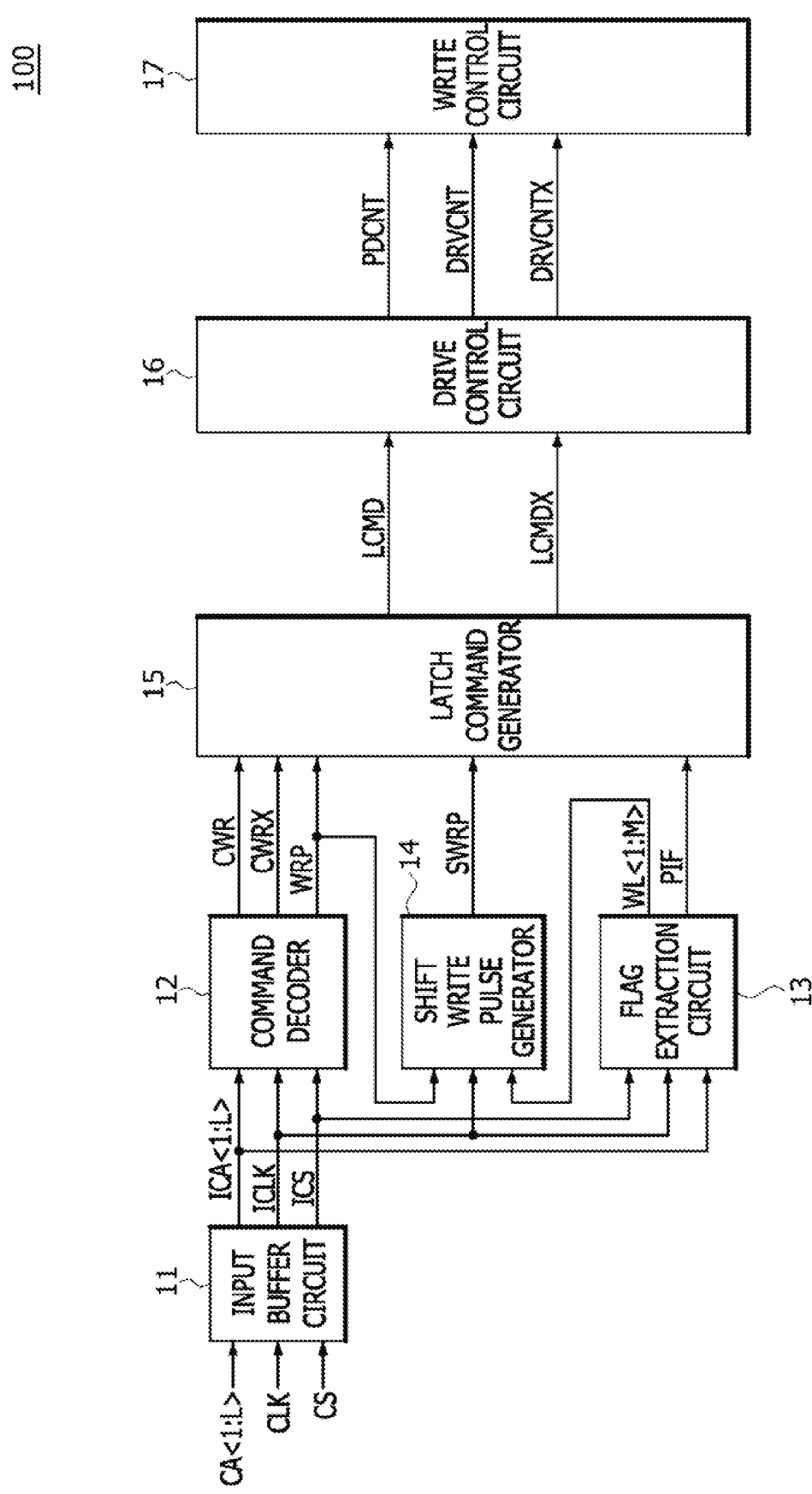
FIG. 1 is a block diagram illustrating a configuration of a semiconductor device according to an embodiment of the present disclosure.

As illustrated in FIG. 1, a semiconductor device 100 according to an embodiment may include an input buffer circuit 11, a command decoder 12, a flag extraction circuit 13, a shift write pulse generator 14, a latch command generator 15, a drive control circuit 16, and a write control circuit 17.

The input buffer circuit 11 may receive first to $L^{th}$ external control signals CA<1:L>, a clock signal CLK, and a chip selection signal CS to generate first to $L^{th}$ internal control signals ICA<1:L>, an internal clock signal ICLK, and an internal chip selection signal ICS. The input buffer circuit 11 may buffer the first to $L^{th}$ external control signals CA<1:L> to generate the first to $L^{th}$ internal control signals ICA<1:L>. The input buffer circuit 11 may buffer the clock signal CLK to generate the internal clock signal ICLK. The input buffer circuit 11 may buffer the chip selection signal CS to generate the internal chip selection signal ICS. The first to $L^{th}$ external control signals CA<1:L> may include a command and an address. The number "L" of bits included in the first to $L^{th}$ external control signals CA<1:L> may be set to be different according to the embodiments.

The command decoder 12 may generate a write command CWR, a pattern write command CWRX, and a write pulse WRP from the first to $L^{th}$ internal control signals ICA<1:L> based on the internal clock signal ICLK and the internal chip selection signal ICS. The command decoder 12 may decode the first to $L^{th}$ internal control signals ICA<1:L> based on the internal clock signal ICLK and the internal chip selection signal ICS to generate the write command CWR. For example, the command decoder 12 may generate the write command CWR when the first to $L^{th}$ internal control signals ICA<1:L> having a first logic level combination are inputted in synchronization with a moment (hereinafter, referred to as a 'rising edge') when a logic level of the internal clock signal ICLK changes from a logic "low" level into a logic "high" level while the internal chip selection signal ICS has a logic "high" level. In some other embodiments, the command decoder 12 may generate the write command CWR while the internal chip selection signal ICS has a logic "low" level or may generate the write command CWR in synchronization with a moment (hereinafter, referred to as a 'falling edge') when a logic level of the internal clock signal ICLK changes from a logic "high" level into a logic "low" level. The write command CWR may be generated when a write operation is performed to store data (DQ of FIG. 6) inputted through a data pad (41 of FIG. 6) into a cell array included in a bank (48 of FIG. 6). The write command CWR may be generated to have a logic "high" level or a logic "low" level according to the embodiments.

The command decoder 12 may decode the first to $L^{th}$ internal control signals ICA<1:L> based on the internal clock signal ICLK and the internal chip selection signal ICS to generate the pattern write command CWRX. For example, the command decoder 12 may generate the pattern write command CWRX when the first to $L^{th}$ internal control signals ICA<1:L> having a second logic level combination are inputted in synchronization with a rising edge of the internal clock signal ICLK while the internal chip selection signal ICS has a logic "high" level. In some other embodiments, the command decoder 12 may generate the pattern write command CWRX while the internal chip selection signal ICS has a logic "low" level or may generate the pattern write command CWRX in synchronization with a falling edge of the internal clock signal ICLK. The pattern write command CWRX is generated when a pattern write operation is performed to store drive data (BD of FIG. 6), which are generated to have a predetermined pattern, into a cell array included in the bank (48 of FIG. 6). The command decoder 12 may generate the write pulse WRP when the write command CWR or the pattern write command CWRX is generated. The first logic level combination of the first to $L^{th}$ internal control signals ICA<1:L> may be set to be different according to the embodiments. The second logic level combination of the first to $L^{th}$ internal control signals ICA<1:L> may also be set to be different according to the embodiments. The pattern write command CWRX may be set to have a logic "high" level or a logic "low" level according to the embodiments. An operation that the pattern write command CWRX is generated in the command decoder 12 will be described below with reference to FIG. 2 later. The word "predetermined" as used herein with respect to a parameter, such as a predetermined pattern and predetermined logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The flag extraction circuit 13 may set a logic level combination of first to $M^{th}$ latency flags WL<1:M> from the first to $L^{th}$ internal control signals ICA<1:L> based on the internal clock signal ICLK and the internal chip selection signal ICS. For example, the flag extraction circuit 13 may set a logic level combination of the first to $M^{th}$ latency flags WL<1:M> from the first to $L^{th}$ internal control signals ICA<1:L> which are inputted in synchronization with a rising edge of the internal clock signal ICLK while the internal chip selection signal ICS is set to have a logic "high" level. The flag extraction circuit 13 may set a logic level combination of the first to $M^{th}$ latency flags WL<1:M> based on a logic level combination of bits selected among bits included in the first to $L^{th}$ internal control signals ICA<1:L> which are inputted in synchronization with a rising edge of the internal clock signal ICLK while the internal chip selection signal ICS is set to have a logic "high" level. The bits, which are used to set a logic level combination of the first to $M^{th}$ latency flags WL<1:M>, among the bits included in the first to $L^{th}$ internal control signals ICA<1:L> may be set to be different according to the embodiments. In some other embodiments, the flag extraction circuit 13 may set a logic level combination of the first to $M^{th}$ latency flags WL<1:M> while the internal chip selection signal ICS is set to have a logic "low" level or may set a logic level combination of the first to $M^{th}$ latency flags WL<1:M> in synchronization with a falling edge of the internal clock signal ICLK. A logic level combination of the first to $M^{th}$ latency flags WL<1:M> may include information on a write latency for the write operation. For example, the write latency may be set to be three when the first to third latency flags WL<1:3> have a logic level combination of '011', and the write latency may be set to be six when the first to third latency flags WL<1:3> have a logic level combination of '110'. In the first to third latency flags WL<1:3>, the logic level combination of '011' means that the first latency flag WL<1> has a logic "low" level and both of the second and third latency flags WL<2:3> have a logic "high" level. In the first to third latency flags WL<1:3>, the logic level combination of '110' means that both of the first and second latency flags WL<1:2> have a logic "high" level and the third latency flag WL<3> has a logic "low" level.

The flag extraction circuit 13 may generate a pattern input flag PIF from the first to $L^{th}$ internal control signals ICA<1:L> based on the internal clock signal ICLK and the internal chip selection signal ICS. For example, the flag extraction circuit 13 may be synchronized with a falling edge of the internal clock signal ICLK to generate the pattern input flag PIF based on a logic level of one bit of the first to $L^{th}$ internal control signals ICA<1:L> while the internal chip selection signal ICS is set to have a logic "high" level. In some other embodiments, the flag extraction circuit 13 may generate the pattern input flag PIF while the internal chip selection signal ICS is set to have a logic "low" level or may generate the pattern input flag PIF in synchronization with a rising edge of the internal clock signal ICLK. The pattern input flag PIF may be generated during the pattern write operation. The bits, which are selected to generate the pattern input flag PIF, among the bits included in the first to $L^{th}$ internal control signals ICA<1:L> may be set to be different according to the embodiments. The pattern input flag PIF may be generated to have a logic "high" level or a logic "low" level according to the embodiments. An operation that the pattern input flag PIF is generated in the flag extraction circuit 13 will also be described below with reference to FIG. 2 later.

The shift write pulse generator 14 may generate a shift write pulse SWRP from the write pulse WRP based on the internal clock signal ICLK and the first to $M^{th}$ latency flags WL<1:M>. The shift write pulse generator 14 may shift the write pulse WRP by the write latency determined by the first to $M^{th}$ latency flags WL<1:M> in synchronization with the internal clock signal ICLK to generate the shift write pulse SWRP. For example, because the write latency is set as three when the first to $M^{th}$ latency flags WL<1:M> have a logic level combination of '011', the shift write pulse generator 14 may shift the write pulse WRP by three cycles of the internal clock signal ICLK to generate the shift write pulse SWRP. The shift write pulse SWRP may be generated at a point in time when the write latency elapses from a point in time when the write pulse WRP is generated. The shift write pulse SWRP may be generated to have a logic "high" level or a logic "low" level according to the embodiments.

The latch command generator 15 may generate a latch command LCMD and a pattern latch command LCMDX from the write command CWR and the pattern write command CWRX based on the write pulse WRP, the shift write pulse SWRP, and the pattern input flag PIF. During the write operation, the latch command generator 15 may latch the write command CWR based on the write pulse WRP and may output the latched signal of the write command CWR as the latch command LCMD. During the pattern write operation, the latch command generator 15 may latch the pattern write command CWRX based on the write pulse WRP and the pattern input flag PIF and may output the latched signal of the pattern write command CWRX as the pattern latch command LCMDX based on the shift write pulse SWRP and the pattern input flag PIF. An operation and a configuration of the latch command generator 15 will be described below with reference to FIG. 3 later.

The drive control circuit 16 may generate a pre-drive control signal PDCNT, a drive control signal DRVCNT, and a pattern drive control signal DRVCNTX based on the latch command LCMD and the pattern latch command LCMDX. The drive control circuit 16 may generate the pre-drive control signal PDCNT and the drive control signal DRVCNT when the latch command LCMD is generated to perform the write operation. The pre-drive control signal PDCNT may be generated to have a logic "high" level or a logic "low" level according to the embodiments. The drive control signal DRVCNT may also be generated to have a logic "high" level or a logic "low" level according to the embodiments. The drive control circuit 16 may generate the pattern drive control signal DRVCNTX when the pattern latch command LCMDX is generated to perform the pattern write operation. The pattern drive control signal DRVCNTX may be generated to have a logic "high" level or a logic "low" level according to the embodiments. An operation and a configuration of the drive control circuit 16 will be described below with reference to FIGS. 4 and 5 later.

The write control circuit 17 may control the write operation and the pattern write operation based on the pre-drive control signal PDCNT, the drive control signal DRVCNT, and the pattern drive control signal DRVCNTX. The write control circuit 17 may store the data (DQ of FIG. 6) inputted through the data pad (41 of FIG. 6) into a cell array included in the bank (48 of FIG. 6) when the write operation is performed to generate the pre-drive control signal PDCNT and the drive control signal DRVCNT. The write control circuit 17 may store the drive data (BD of FIG. 6) driven to a predetermined logic level (e.g., a logic "low" level) into a cell array included in the bank (48 of FIG. 6) when the pattern write operation is performed to generate the pattern drive control signal DRVCNTX. An operation and a configuration of the write control circuit 17 will be described below with reference to FIGS. 6 to 9 later.

Referring to FIG. 2, a condition for generating the pattern write command CWRX in the command decoder 12 and a condition for generating the pattern input flag PIF in the flag extraction circuit 13 are illustrated. After the first internal control signal ICA<1> having a logic "low(L)" level, the second internal control signal ICA<2> having a logic "low (L)" level, and the third internal control signal ICA<3> having a logic "high(H)" level are inputted in synchronization with a rising edge of the internal clock signal ICLK while the internal chip selection signal ICS is at a logic "high(H)", the pattern write command CWRX and the pattern input flag PIF may be respectively generated by the command decoder 12 and the flag extraction circuit 13 to perform the pattern write operation when the fifth internal control signal ICA<5> having a logic "high(H)" level is inputted in synchronization with a falling edge of the internal clock signal ICLK. In the internal chip selection signal ICS of FIG. 2, a logic level indicated by "X" means a "DON'T CARE STATE". Moreover, in the first to seventh internal control signals ICA<1:7> of FIG. 2, a logic level indicated by "V" means a valid logic level for various internal operations.

Figure 3:
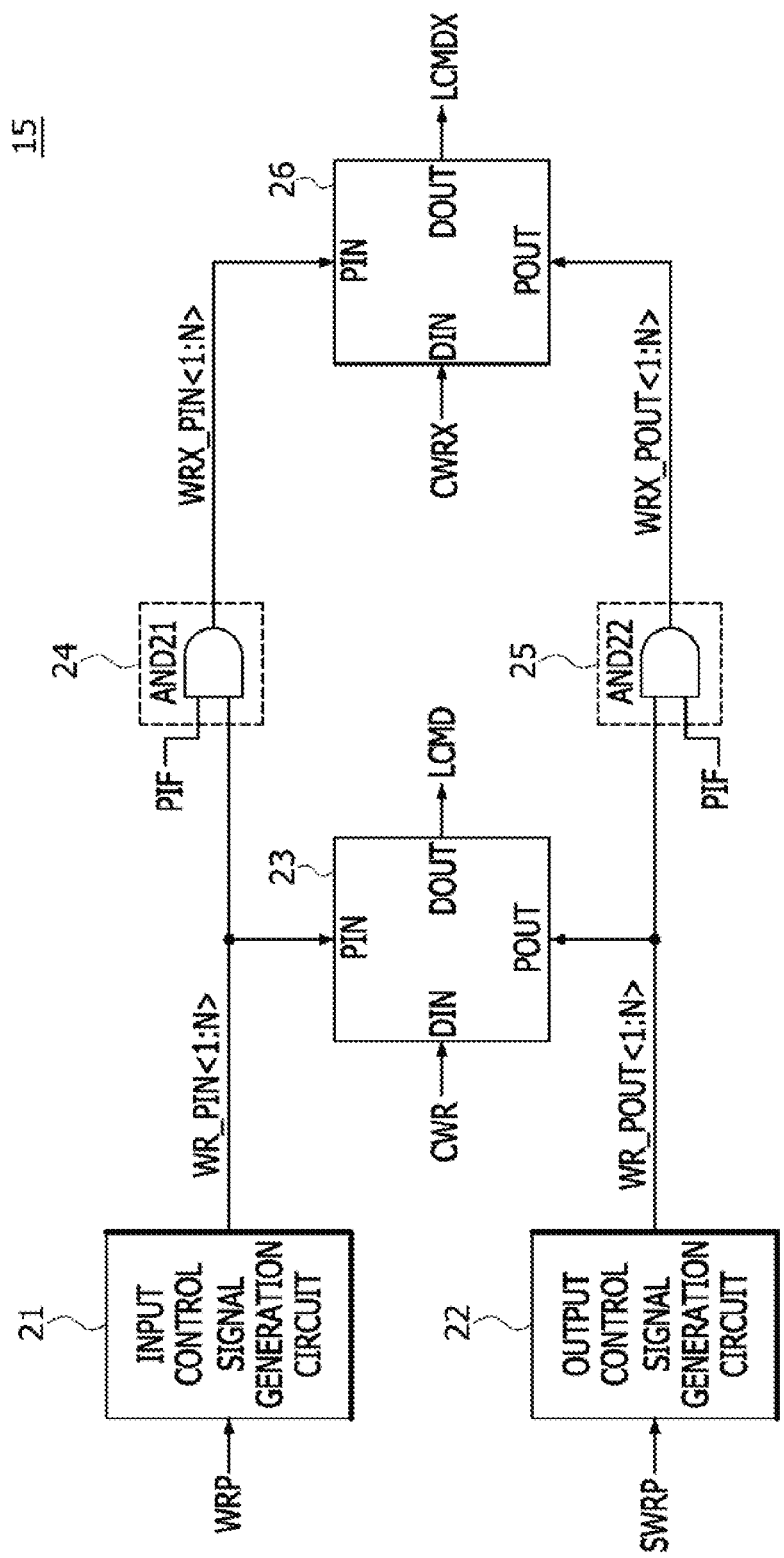
FIG. 3 is a schematic view illustrating an example of a latch command generator included in the semiconductor device of FIG. 1.

Referring to FIG. 3, the latch command generator 15 may include an input control signal generation circuit 21, an output control signal generation circuit 22, a latch command pipe 23, a pattern input control signal generation circuit 24, a pattern output control signal generation circuit 25, and a pattern latch command pipe 26.

The input control signal generation circuit 21 may generate first to $N^{th}$ input control signals WR_PIN<1:N> based on the write pulse WRP. The input control signal generation circuit 21 may sequentially and iteratively generate the first to $N^{th}$ input control signals WR_PIN<1:N> whenever the write pulse WRP is created. For example, the input control signal generation circuit 21 may generate the first input control signal WR_PIN<1> when the write pulse WRP is created a first time, may generate the $N^{th}$ input control signal WR_PIN<N> when the write pulse WRP is created an $N^{th}$ time, and may generate the first input control signal WR_PIN<1> when the write pulse WRP is created an $(N+1)^{th}$ time. The number of bits included in the first to $N^{th}$ input control signals WR_PIN<1:N> may be set to be different according to the embodiments.

The output control signal generation circuit 22 may generate first to $N^{th}$ output control signals WR_POUT<1:N> based on the shift write pulse SWRP. The output control signal generation circuit 22 may sequentially and iteratively generate the first to $N^{th}$ output control signals WR_POUT<1:N> whenever the shift write pulse SWRP is created. For example, the output control signal generation circuit 22 may generate the first output control signal WR_POUT<1> when the shift write pulse SWRP is created a first time, may generate the $N^{th}$ output control signal WR_POUT<N> when the shift write pulse SWRP is created an $N^{th}$ time, and may generate the first output control signal WR_POUT<1> when the shift write pulse SWRP is created an $(N+1)^{th}$ time. The number of bits included in the first to $N^{th}$ output control signals WR_POUT<1:N> may be set to be different according to the embodiments.

The latch command pipe 23 may generate the latch command LCMD from the write command CWR based on the first to $N^{th}$ input control signals WR_PIN<1:N> and the first to $N^{th}$ output control signals WR_POUT<1:N>. The latch command pipe 23 may be synchronized with the first to $N^{th}$ input control signals WR_PIN<1:N> to latch the write command CWR and may be synchronized with the first to $N^{th}$ output control signals WR_POUT<1:N> to output the latched signal of the write command CWR as the latch command LCMD.

The pattern input control signal generation circuit 24 may generate first to $N^{th}$ pattern input control signals WRX_PIN<1:N> from the first to $N^{th}$ input control signals WR_PIN<1:N> based on the pattern input flag PIF. The pattern input control signal generation circuit 24 may perform an AND operation and may include, for example but not limited to, an AND gate AND21. The pattern input control signal generation circuit 24 may buffer the first to $N^{th}$ input control signals WR_PIN<1:N> to output the buffered signals of the first to $N^{th}$ input control signals WR_PIN<1:N> as the first to $N^{th}$ pattern input control signals WRX_PIN<1:N> when the pattern input flag PIF having a logic "high" level is inputted during the pattern write operation.

The pattern output control signal generation circuit 25 may generate first to $N^{th}$ pattern output control signals WRX_POUT<1:N> from the first to $N^{th}$ output control signals WR_POUT<1:N> based on the pattern input flag PIF. The pattern output control signal generation circuit 25 may perform an AND operation and may include, for example but not limited to, an AND gate AND22. The pattern output control signal generation circuit 25 may buffer the first to $N^{th}$ output control signals WR_POUT<1:N> to output the buffered signals of the first to $N^{th}$ output control signals WR_POUT<1:N> as the first to $N^{th}$ pattern output control signals WRX_POUT<1:N> when the pattern input flag PIF having a logic "high" level is inputted during the pattern write operation.

The pattern latch command pipe 26 may generate the pattern latch command LCMDX from the pattern write command CWRX based on the first to $N^{th}$ pattern input control signals WRX_PIN<1:N> and the first to $N^{th}$ pattern output control signals WRX_POUT<1:N>. The pattern latch command pipe 26 may be synchronized with the first to $N^{th}$ pattern input control signals WRX_PIN<1:N> to latch the pattern write command CWRX and may be synchronized with the first to $N^{th}$ pattern output control signals WRX_POUT<1:N> to output the latched signal of the pattern write command CWRX as the pattern latch command LCMDX.

Figure 4:
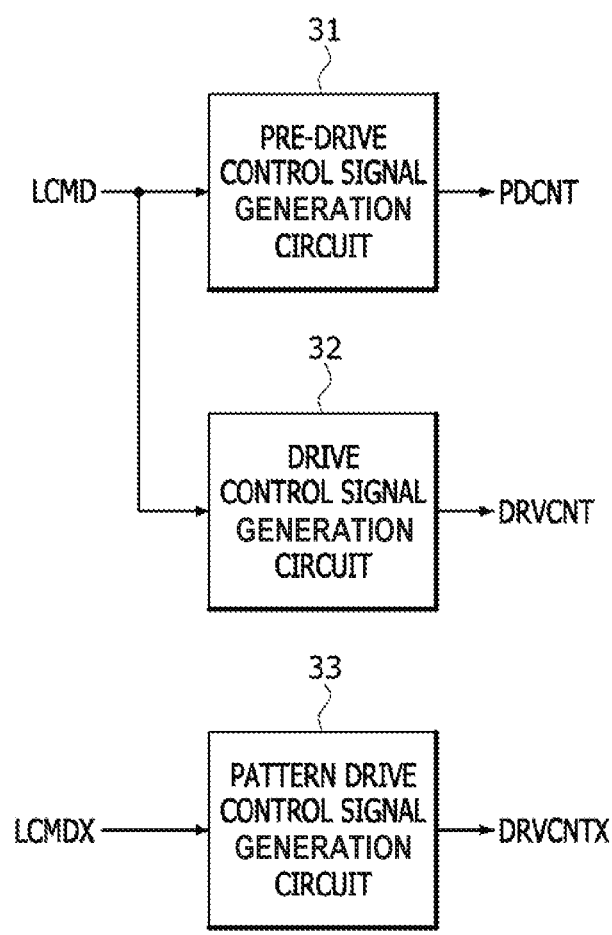
FIG. 4 is a block diagram illustrating an example of a drive control circuit included in the semiconductor device of FIG. 1.

Referring to FIG. 4, the drive control circuit 16 may include a pre-drive control signal generation circuit 31, a drive control signal generation circuit 32, and a pattern drive control signal generation circuit 33. The pre-drive control signal generation circuit 31 may generate the pre-drive control signal PDCNT when the latch command LCMD is generated to perform the write operation. The drive control signal generation circuit 32 may generate the drive control signal DRVCNT when the latch command LCMD is generated to perform the write operation. In an embodiment, the latch command LCMD, the pre-drive control signal PDCNT, and the drive control signal DRVCNT may be generated to have a logic "high" level. In some other embodiments, the latch command LCMD, the pre-drive control signal PDCNT, and the drive control signal DRVCNT may be generated to have a logic "low" level. The pattern drive control signal generation circuit 33 may generate the pattern drive control signal DRVCNTX when the pattern latch command LCMDX is generated to perform the pattern write operation. In an embodiment, the pattern latch command LCMDX and the pattern drive control signal DRVCNTX may be generated to have a logic "high" level. In some other embodiments, the pattern latch command LCMDX and the pattern drive control signal DRVCNTX may be generated to have a logic "low" level.

Figure 5:
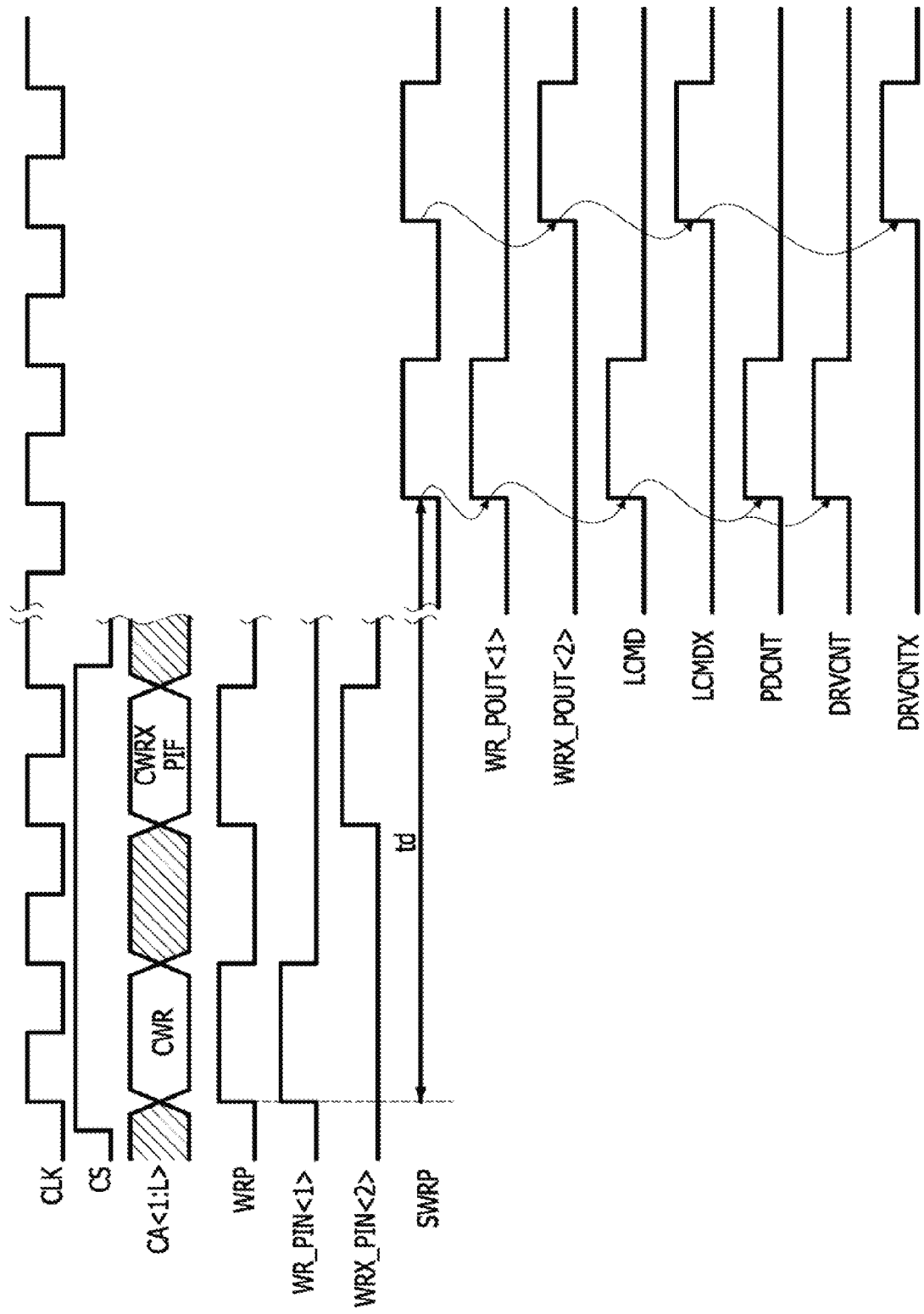
FIG. 5 is a timing diagram illustrating an operation of the semiconductor device shown in FIGS. 1 to 4.

Operations for generating the pre-drive control signal PDCNT, the drive control signal DRVCNT, and the pattern drive control signal DRVCNTX in the semiconductor device 100 illustrated in FIGS. 1 to 4 will be described hereinafter with reference to FIG. 5.

When the first to $L^{th}$ internal control signals having a logic level combination for generating the write command CWR are inputted to perform the write operation, the write pulse WRP may be generated to have a logic "high" level a first time. When the first to $L^{th}$ internal control signals having a logic level combination for generating the pattern write command CWRX and the pattern input flag PIF are inputted to perform the pattern write operation, the write pulse WRP may be generated to have a logic "high" level a second time.

The first input control signal WR_PIN<1> may be generated to have a logic "high" level by the write pulse WRP generated a first time. The write command CWR may be latched by the first input control signal WR_PIN<1> generated to have a logic "high" level. The second pattern input control signal WRX_PIN<2> may be generated to have a logic "high" level by the write pulse WRP generated a second time. The second pattern input control signal WRX_PIN<2> may be generated by buffering the second input control signal WR_PIN<2> generated to have a logic "high" level by the write pulse WRP generated a second time while the pattern input flag PIF is generated. The pattern write command CWRX may be latched by the second pattern input control signal WRX_PIN<2> generated to have a logic "high" level.

The write pulse WRP may be shifted by a period td, which is set as the write latency, to generate the shift write pulse SWRP. The first output control signal WR_POUT<1> may be generated to have a logic "high" level by the shift write pulse SWRP generated a first time. The latched signal of the write command CWR may be outputted as the latch command LCMD by the first output control signal WR_POUT<1> generated to have a logic "high" level. When the latch command LCMD is generated to have a logic "high" level, the pre-drive control signal PDCNT and the drive control signal DRVCNT may be generated to have a logic "high" level and the write operation may be performed.

The second pattern output control signal WRX_POUT<2> may be generated to have a logic "high" level by the shift write pulse SWRP generated a second time. The second pattern output control signal WRX_POUT<2> may be generated by buffering the second output control signal WR_POUT<2> generated to have a logic "high" level by the shift write pulse SWRP generated a second time while the pattern input flag PIF is generated. The latched signal of the pattern write command CWRX may be outputted as the pattern latch command LCMDX by the second pattern output control signal WRX_POUT<2> generated to have a logic "high" level. When the pattern latch command LCMDX is generated to have a logic "high" level, the pattern drive control signal DRVCNTX may be generated to have a logic "high" level and the pattern write operation may be performed.

Figure 6:
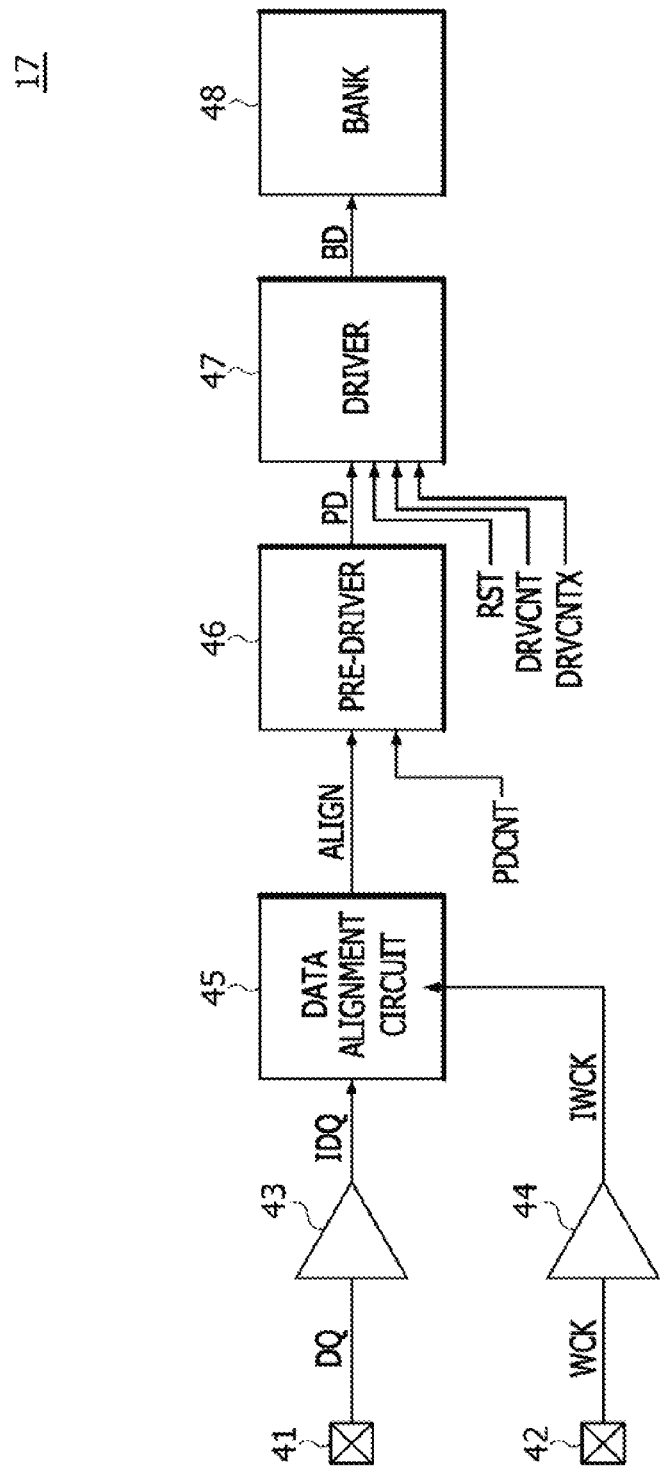
FIG. 6 is a block diagram illustrating an example of a write control circuit included in the semiconductor device of FIG. 1.

Referring to FIG. 6, the write control circuit 17 may include the data pad 41, a clock pad 42, a data buffer 43, a clock buffer 44, a data alignment circuit 45, a pre-driver 46, a driver 47, and the bank 48.

The data buffer 43 may buffer the data DQ inputted through the data pad 41 to generate internal data IDQ. The clock buffer 44 may buffer a data clock signal WCK inputted thorough the clock pad 42 to generate an internal data clock signal IWCK. The data clock signal WCK may be used to receive or output the data DQ. The data clock signal WCK may be set to have a frequency which is "K" times a frequency of the clock signal CLK to enhance an operation speed of the semiconductor device 100 (where, "K" denotes a natural number which is equal to or greater than two). The data alignment circuit 45 may align the internal data IDQ in synchronization with the internal data clock signal IWCK to generate aligned data ALIGN.

The pre-driver 46 may receive the aligned data ALIGN based on the pre-drive control signal PDCNT to generate pre-data PD. The pre-driver 46 may drive the pre-data PD to have the same logic level as the aligned data ALIGN when the pre-drive control signal PDCNT is generated by the write operation.

The driver 47 may receive the pre-data PD based on the drive control signal DRVCNT and the pattern drive control signal DRVCNTX to generate the drive data BD which are stored into the bank 48. The driver 47 may drive the drive data BD to have the same logic level as the pre-data PD when the drive control signal DRVCNT is generated by the write operation. The driver 47 may drive the drive data BD to a predetermined logic level when the pattern drive control signal DRVCNTX is generated by the pattern write operation. The driver may receive a reset signal RST. The reset signal RST may be generated for an initialization operation.

Figure 7:
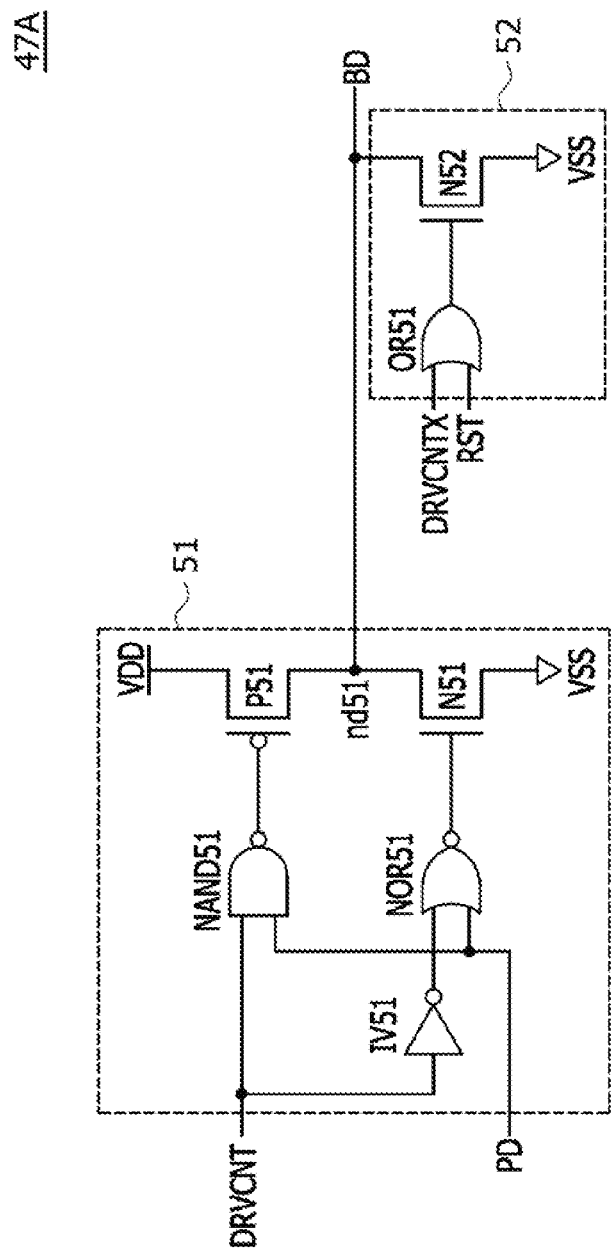
FIG. 7 is a circuit diagram illustrating an example of a driver included in the write control circuit of FIG. 6.

As illustrated in FIG. 7, a driver 47A corresponding to one example of the driver 47 illustrated in FIG. 6 may include a write drive circuit 51 and a pattern write drive circuit 52.

The write drive circuit 51 may be configured to perform inversion, NAND, and NOR operations. For example, the write drive circuit 51 may include an inverter IV51, a NAND gate NAND51, a NOR gate NOR51, a PMOS transistor P51, and an NMOS transistor N51. The inverter IV51 may inversely buffer the drive control signal DRVCNT to output the inversely buffered signal of the drive control signal DRVCNT. The NAND gate NAND51 may receive the drive control signal DRVCNT and the pre-data PD to perform a logical NAND operation of the drive control signal DRVCNT and the pre-data PD. The NOR gate NOR51 may receive an output signal of the inverter IV51 and the pre-data PD to perform a logical NOR operation of the output signal of the inverter IV51 and the pre-data PD. The PMOS transistor P51 may be turned on by an output signal of the NAND gate NAND51 to drive the drive data BD to a power supply voltage VDD. The NMOS transistor N51 may be turned on by an output signal of the NOR gate NOR51 to drive the drive data BD to a ground voltage VSS. The write drive circuit 51 may drive the drive data BD to have the same logic level as the pre-data PD when the drive control signal DRVCNT is generated to have a logic "high" level by the write operation.

The pattern write drive circuit 52 may be configured to perform an OR operation. The pattern write drive circuit 52 may include, for example, an OR gate OR51 and an NMOS transistor N52. The OR gate OR51 may receive the pattern drive control signal DRVCNTX and a reset signal RST to perform a logical OR operation of the pattern drive control signal DRVCNTX and the reset signal RST. The reset signal RST may be generated to have a logic "high" level for an initialization operation. The NMOS transistor N52 may be turned on by an output signal of the OR gate OR51 to drive the drive data BD to the ground voltage VSS. The pattern write drive circuit 52 may drive the drive data BD to have a logic "low" level when the pattern drive control signal DRVCNTX is generated by the pattern write operation.

Figure 8:
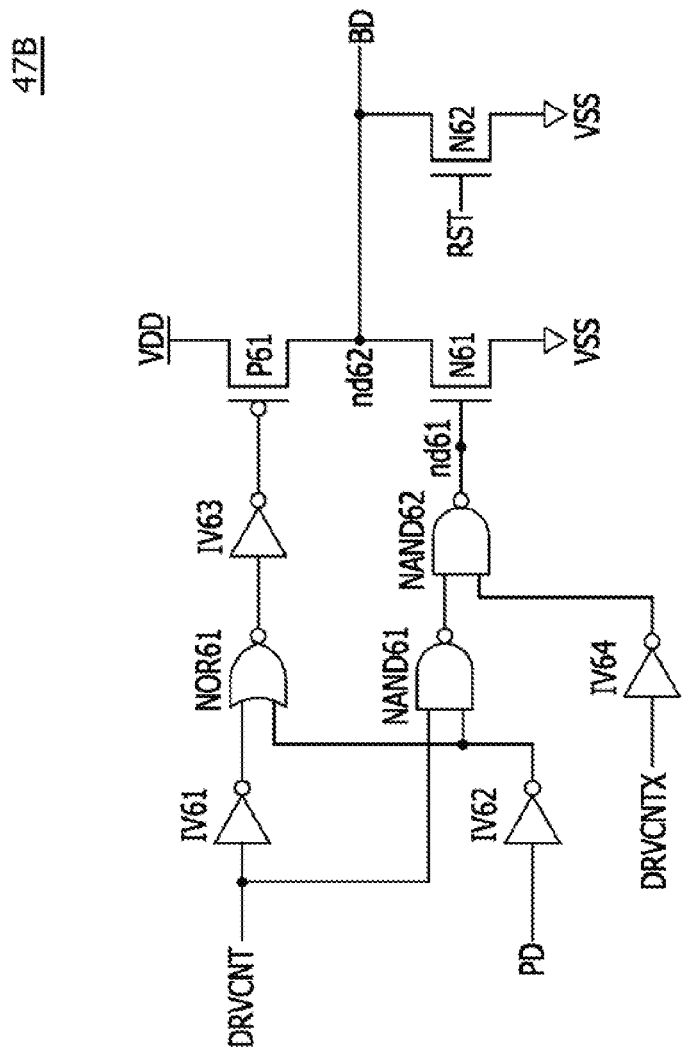
FIG. 8 is a circuit diagram illustrating another example of a driver included in the write control circuit of FIG. 6.

As illustrated in FIG. 8, a driver 47B corresponding to an example of the driver 47 illustrated in FIG. 6 may be configured to perform inversion, NOR, and NAND operations. For example the driver 47B may include inverters IV61~IV64, a NOR gate NOR61, NAND gates NAND61 and NAND62, a PMOS transistor P61, and NMOS transistors N61 and N62. The inverter 61 may inversely buffer the drive control signal DRVCNT to output the inversely buffered signal of the drive control signal DRVCNT. The inverter IV62 may inversely buffer the pre-data PD to output the inversely buffered signal of the pre-data PD. The NOR gate NOR61 may receive an output signal of the inverter 61 and an output signal of the inverter IV62 to perform a logical NOR operation of the output signal of the inverter 61 and the output signal of the inverter IV62. The inverter IV63 may inversely buffer an output signal of the NOR gate NOR61 to output the inversely buffered signal of the output signal of the NOR gate NOR61. The NAND gate NAND61 may receive the drive control signal DRVCNT and an output signal of the inverter IV62 to perform a logical NAND operation of the drive control signal DRVCNT and the output signal of the inverter IV62. The inverter IV64 may inversely buffer the pattern drive control signal DRVCNTX to output the inversely buffered signal of the pattern drive control signal DRVCNTX. The NAND gate NAND62 may perform a logical NAND operation of an output signal of the NAND gate NAND61 and an output signal of the inverter IV64 to output the result of the logical NAND operation to a node nd61. The PMOS transistor P61 may be turned on by an output signal of the inverter IV63 to drive a node nd62, through which the drive data BD are outputted, to the power supply voltage VDD. The NMOS transistor N61 may be turned on by a signal of the node nd61 to drive the drive data BD to the ground voltage VSS. The NMOS transistor N62 may be turned on by the reset signal RST to drive the drive data BD to the ground voltage VSS. The driver 47B may drive the drive data BD to have the same logic level as the pre-data PD when the drive control signal DRVCNT is generated to have a logic "high" level by the write operation.

The drive 47B may drive the drive data BD to have a logic "low" level when the pattern drive control signal DRVCNTX is generated by the pattern write operation.

Figure 9:
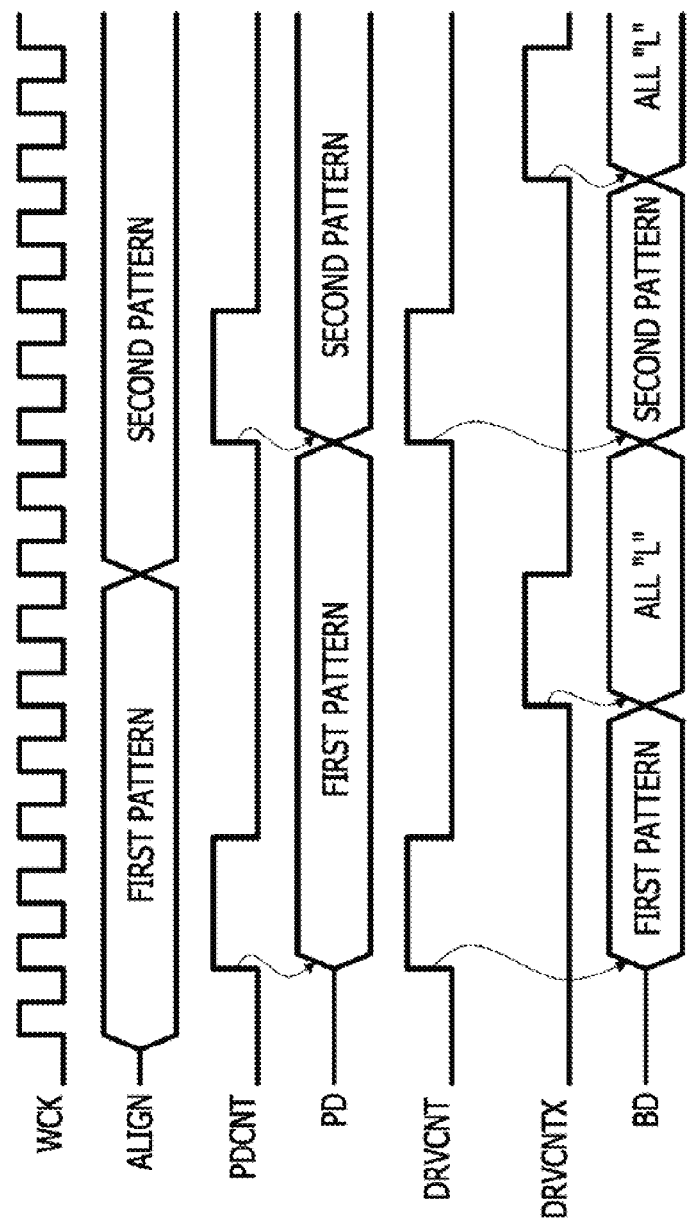
FIG. 9 is a timing diagram illustrating an operation of the write control circuit shown in FIG. 6.

An operation of the write control circuit 17 having an aforementioned configuration will be described hereinafter with reference to FIG. 9.

When the write operation and the pattern write operation are sequentially performed while the aligned data ALIGN are generated from the data DQ having a first pattern in synchronization with the data clock signal WCK, the pre-data PD and the drive data BD may be driven to have the first pattern by the drive control signal DRVCNT and the pattern drive control signal DRVCNTX which are generated by the write operation, and the drive data BD may be driven to have a logic "low" level by the pattern drive control signal DRVCNTX which is generated by the pattern write operation. The drive data BD may be stored into cell arrays included in the bank (48 of FIG. 6) during the write operation and the pattern write operation. The drive data BD may include a plurality of bits according to the embodiments, all of the bits included in the drive data BD may be driven to have the first pattern during the write operation, and all of the bits included in the drive data BD may be set to have a logic "low" level during the pattern write operation.

When the write operation and the pattern write operation are sequentially performed while the aligned data ALIGN are generated from the data DQ having a second pattern in synchronization with the data clock signal WCK, the pre-data PD and the drive data BD may be driven to have the second pattern by the drive control signal DRVCNT and the pattern drive control signal DRVCNTX which are generated by the write operation, and the drive data BD may be driven to have a logic "low" level by the pattern drive control signal DRVCNTX which is generated by the pattern write operation. The drive data BD may include a plurality of bits according to the embodiments, all of the bits included in the drive data BD may be driven to have the second pattern during the write operation, and all of the bits included in the drive data BD may be set to have a logic "low" level during the pattern write operation.

As described above, the semiconductor device 100 according to an embodiment may perform the write operation as well as the pattern write operation with low power consumption and a minimum layout area. The semiconductor device 100 does not use toggling data during the pattern write operation, thereby minimizing a layout area of circuits necessary for the write operation. The semiconductor device 100 may include the latch command pipe 23 and the pattern latch command pipe 26 which are capable of latching respective ones of the write command CWR and the pattern write command CWRX that are sequentially generated, thereby sequentially performing the write operation and the pattern write operation with minimizing the power consumption and the layout area of the semiconductor device 100.

Figure 10:
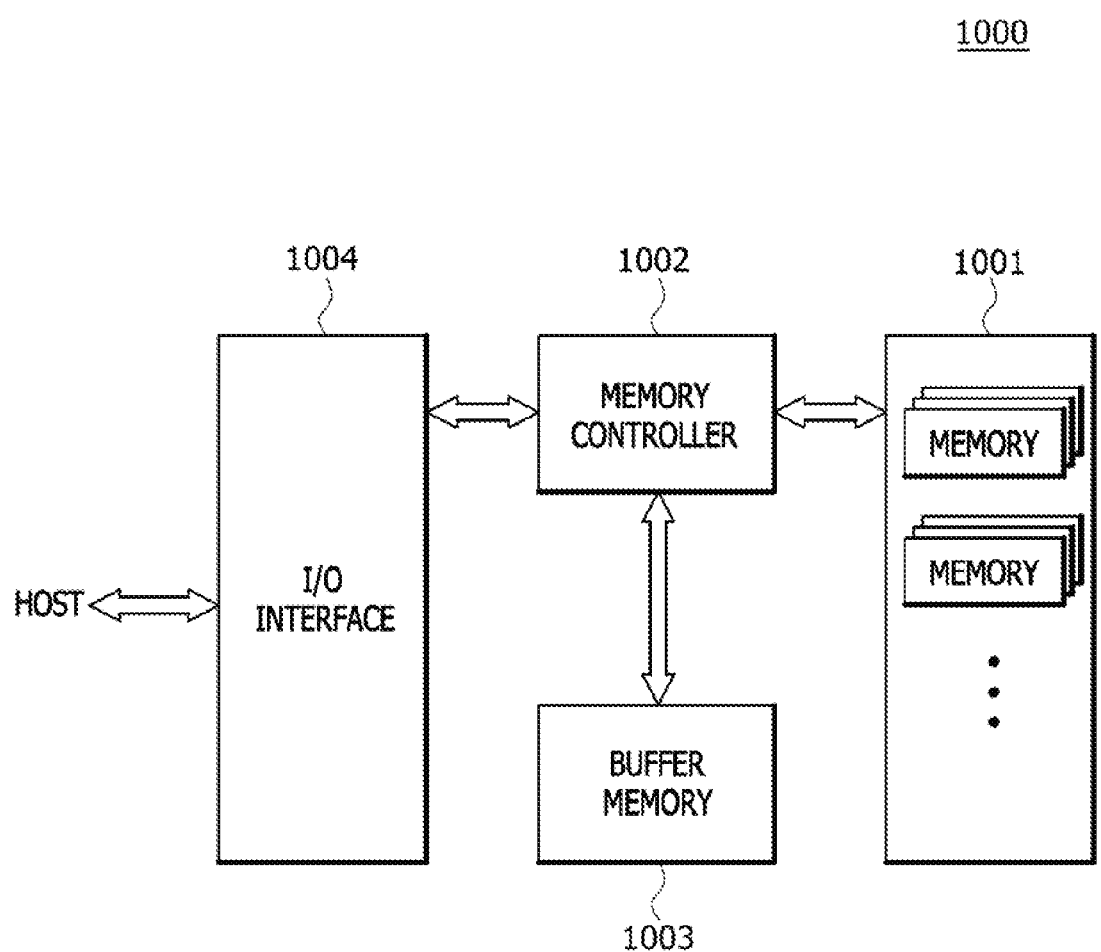
FIG. 10 is a block diagram illustrating a configuration of an electronic system employing the semiconductor device shown in FIG. 1.

The semiconductor devices 100 described with reference to FIG. 1 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 100 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a drive control circuit configured to generate a pre-drive control signal and a drive control signal based on a latch command and configured to generate a pattern drive control signal based on a pattern latch command; and
    a write control circuit configured to store drive data generated from data inputted through a data pad based on the pre-drive control signal and the drive control signal into a cell array and configured to store the drive data driven to a predetermined logic level based on the pattern drive control signal into the cell array.

2. The semiconductor device of claim 1, wherein the drive data that is driven to the predetermined logic level based on the pattern drive control signal is performed after the drive data is generated from the data inputted through the data pad based on the pre-drive control signal and the drive control signal.

3. The semiconductor device of claim 1, wherein generation of the drive data based on the pre-drive control signal and the drive control signal and generation of the drive data to the predetermined logic level based on the pattern drive control signal are sequentially performed by the write control circuit.

4. The semiconductor device of claim 1, wherein the drive control circuit includes:
- a pre-drive control signal generation circuit configured to generate the pre-drive control signal when the latch command is generated;
- a drive control signal generation circuit configured to generate the drive control signal when the latch command is generated; and
- a pattern drive control signal generation circuit configured to generate the pattern drive control signal when the pattern latch command is generated.

5. The semiconductor device of claim 1, wherein the write control circuit includes:
- a pre-driver configured to drive pre-data based on the data when the pre-drive control signal is generated; and
- a driver configured to drive the drive data based on the pre-data when the drive control signal or the pattern drive control signal is generated.

6. The semiconductor device of claim 1, wherein the latch command is generated by latching a write command during a write operation that the drive data generated from the data are stored into the cell array.

7. The semiconductor device of claim 1, wherein the pattern latch command is generated by latching a pattern write command during a pattern write operation that the drive data driven to a predetermined logic level are stored into the cell array.

8. The semiconductor device of claim 1, further comprising a latch command generator configured to generate the latch command and the pattern latch command from the write command and the pattern write command based on a write pulse, a shift write pulse, and a pattern input flag.

9. The semiconductor device of claim 8,
- wherein the write command is generated during a write operation that the drive data generated from the data are stored into the cell array; and
- wherein the pattern write command is generated during a pattern write operation that the drive data driven to a predetermined logic level are stored into the cell array.

10. The semiconductor device of claim 9, wherein the write pulse is generated during the write operation or the pattern write operation.

11. The semiconductor device of claim 10, wherein the shift write pulse is generated by shifting the write pulse by a write latency.

12. The semiconductor device of claim 9, wherein the pattern input flag is generated during the pattern write operation.

13. The semiconductor device of claim 8, wherein the latch command generator includes a latch command pipe configured to latch the write command based on an input control signal generated from the write pulse and configured to output the latched write command as the latch command based on an output control signal generated from the shift write pulse.

14. The semiconductor device of claim 13, wherein the latch command generator further includes a pattern latch command pipe configured to latch the pattern write command based on a pattern input control signal generated from the pattern input flag and the input control signal and configured to output the latched pattern write command as the pattern latch command based on a pattern output control signal generated from the pattern input flag and the output control signal.

15. A semiconductor device comprising:
- a latch command generator configured to generate a latch command from a write command during a write operation and configured to generate a pattern latch command from a pattern write command during a pattern write operation; and
- a drive control circuit configured to generate a pre-drive control signal and a drive control signal based on the latch command during the write operation and configured to generate a pattern drive control signal based on the pattern latch command during the pattern write operation,
- wherein the write operation is performed to store drive data generated from data inputted through a data pad into a cell array; and
- wherein the pattern write operation is performed to store the drive data driven to a predetermined logic level into the cell array.

16. The semiconductor device of claim 15, wherein the latch command generator is configured to generate the latch command and the pattern latch command from the write command and the pattern write command based on a write pulse, a shift write pulse, and a pattern input flag.

17. The semiconductor device of claim 16,
- wherein the write pulse is generated during the write operation or the pattern write operation; and
- wherein the shift write pulse is generated by shifting the write pulse by a write latency.

18. The semiconductor device of claim 16, wherein the pattern input flag is generated during the pattern write operation.

19. The semiconductor device of claim 16, wherein the latch command generator includes a latch command pipe configured to latch the write command based on an input control signal generated from the write pulse and configured to output the latched write command as the latch command based on an output control signal generated from the shift write pulse.

20. The semiconductor device of claim 19, wherein the latch command generator further includes a pattern latch command pipe configured to latch the pattern write command based on a pattern input control signal generated from the pattern input flag and the input control signal and configured to output the latched pattern write command as the pattern latch command based on a pattern output control signal generated from the pattern input flag and the output control signal.

21. The semiconductor device of claim 15, further comprising a write control circuit configured to store drive data generated from data inputted through a data pad based on the pre-drive control signal and the drive control signal into a cell array or configured to store the drive data driven to a predetermined logic level based on the pattern drive control signal into the cell array.

* * * * *